United States Patent
Wu et al.

(10) Patent No.: US 11,532,924 B2
(45) Date of Patent: Dec. 20, 2022

(54) DISTRIBUTED FEEDBACK LASER ARRAY

(71) Applicant: National Taiwan University, Taipei (TW)

(72) Inventors: Chao-Hsin Wu, Taipei (TW); Chieh Lo, New Taipei (TW)

(73) Assignee: National Taiwan University, Taipei (TW)

( * ) Notice: Subject to any disclaimer, the term of this patent is extended or adjusted under 35 U.S.C. 154(b) by 203 days.

(21) Appl. No.: 16/940,376

(22) Filed: Jul. 27, 2020

(65) Prior Publication Data

US 2022/0029389 A1    Jan. 27, 2022

(51) Int. Cl.
*H01S 5/40* (2006.01)

(52) U.S. Cl.
CPC ............ *H01S 5/4037* (2013.01); *H01S 5/405* (2013.01); *H01S 5/4062* (2013.01)

(58) Field of Classification Search
CPC ..... H01S 5/12–1246; H01S 5/40–4093; H01S 5/04256; H01S 5/0625; H01S 5/06258; H01S 5/3095; H01S 5/06243
See application file for complete search history.

(56) References Cited

U.S. PATENT DOCUMENTS

| | | | |
|---|---|---|---|
| 5,345,459 A * | 9/1994 | Richardson | H01S 5/0427 372/50.1 |
| 6,810,064 B1 * | 10/2004 | Coldren | H01S 5/18316 372/96 |
| 8,194,712 B2 * | 6/2012 | Muller | H01S 5/4043 372/50.12 |
| 2010/0238964 A1 * | 9/2010 | Matsushita | B82Y 20/00 372/45.012 |
| 2021/0194216 A1 * | 6/2021 | Maros | H01S 5/2215 |

FOREIGN PATENT DOCUMENTS

| CN | 106300017 | * | 1/2017 | ........... H01S 5/4087 |
|---|---|---|---|---|
| CN | 113823995 | * | 12/2021 | ............. H01S 5/183 |

* cited by examiner

*Primary Examiner* — Xinning(Tom) Niu
*Assistant Examiner* — Delma R Fordé
(74) *Attorney, Agent, or Firm* — Winston Hsu

(57) ABSTRACT

A distributed feedback (DFB) laser array includes a substrate, a semiconductor stacked structure, a first electrode layer, and a second electrode layer. The semiconductor stacked structure is formed above a surface of the substrate and includes two light-emitting modules and a tunnel junction. Each light-emitting module of the two light-emitting modules includes an active layer, a first cladding layer, and a second cladding layer. The active layer is installed between the first cladding layer and the second cladding layer, and the active layer has multiple lasing spots along a first direction, wherein the multiple lasing spots are used for generating multiple lasers. The tunnel junction is installed between the two light-emitting modules. The first electrode layer is formed above the semiconductor stacked structure. The second electrode layer is formed above another surface of the substrate.

12 Claims, 1 Drawing Sheet

DISTRIBUTED FEEDBACK LASER ARRAY

BACKGROUND OF THE INVENTION

1. Field of the Invention

The present invention relates to a distributed feedback laser array, particularly to a distributed feedback laser array that utilizes broad-area distributed feedback laser to combine with a tunnel junction.

2. Description of the Prior Art

In the prior art, a design of a broad-area distributed feedback (DFB) laser can increase emitting power of a lasing spot in the broad-area DFB laser, wherein a feature of the design is to make the broad-area DFB laser have a striped geometric shape. That is, the prior art can design the broad-area DFB laser into a DFB laser bar. Besides, although the prior art can also stack multiple DFB laser bars to form a DFB laser array, a disadvantage of the DFB laser array is that a field of laser emitted by the DFB laser array is poorer. Therefore, the DFB laser array requires multiple lenses which are installed between each two DFB laser bars of the DFB laser array and other predetermined positions, resulting in the DFB laser array needing to accurately position the multiple lenses to make a manufacturing process of the DFB laser array be complicated and cost of the DFB laser array be increased. Therefore, how to simplify the manufacturing process of the DFB laser array and reduce the cost of the DFB laser array has become an important issue for a designer of the DFB laser array.

SUMMARY OF THE INVENTION

An embodiment of the present invention provides a distributed feedback laser array includes a substrate, a semiconductor stacked structure, a first electrode layer, and a second electrode layer. The semiconductor stacked structure is formed above a surface of the substrate and includes two light-emitting modules and a tunnel junction. Each light-emitting module of the two light-emitting modules includes an active layer, a first cladding layer, and a second cladding layer. The active layer is installed between the first cladding layer and the second cladding layer, and the active layer comprises multiple lasing spots along a first direction for generating the at least one laser. The tunnel junction is installed between the two light-emitting modules. The first electrode layer is formed above the semiconductor stacked structure. The second electrode layer is formed above another surface of the substrate.

In another embodiment of the present invention, polarity of the first cladding layer is different from polarity of the second cladding layer.

In another embodiment of the present invention, the first cladding layer is installed above the active layer, and the active layer is installed above the second cladding layer.

In another embodiment of the present invention, the active layer comprises a semiconductor material for generating the multiple lasers, and the semiconductor material is indium gallium arsenide phosphide (InGaAsP) or indium gallium aluminum arsenide (InGaAlAs).

In another embodiment of the present invention, the substrate is composed of indium phosphide (InP).

In another embodiment of the present invention, the first cladding layer is composed of indium phosphide (InP) or indium gallium arsenide phosphide (InGaAsP), and the second cladding layer is composed of indium phosphide (InP).

In another embodiment of the present invention, the tunnel junction is composed of indium gallium arsenide/indium phosphide (InGaAs/InP), or indium gallium arsenide/indium gallium arsenide (InGaAs/InGaAs), or indium aluminum arsenide/indium phosphide (InAlAs/InP), or aluminum arsenide/indium phosphide (AlAs/InP).

In another embodiment of the present invention, a material of the first electrode layer is titanium (Ti), or platinum (Pt), or aurum (Au).

In another embodiment of the present invention, a material of the second electrode layer is aurum (Au), or germanium (Ge), or nickel (Ni).

In another embodiment of the present invention, the first electrode layer is used for controlling at least one lasing spot of the multiple lasing spots to generate at least one laser of the multiple lasers.

In another embodiment of the present invention, the first electrode layer has a predetermined pattern, and the first electrode layer controls the at least one lasing spot of the multiple lasing spots to generate the at least one laser of the multiple lasers through the predetermined pattern.

Another embodiment of the present invention provides a distributed feedback laser array includes a substrate, a semiconductor stacked structure, a first electrode layer, and a second electrode layer. The semiconductor stacked structure includes two light-emitting modules and a tunnel junction. Each light-emitting module of the two light-emitting modules includes multiple lasing spots along a first direction, wherein the multiple lasing spots are used for generating multiple lasers. The tunnel junction is installed between the two light-emitting modules. The first electrode layer is formed above the semiconductor stacked structure and having a predetermined pattern, and the first electrode layer with the predetermined pattern controls at least one lasing spot of the multiple lasing spots to generate at least one laser of the multiple lasers through the predetermined pattern. The second electrode layer is formed above another surface of the substrate.

The present invention provides a distributed feedback laser array. The distributed feedback laser array uses a tunnel junction to be installed between two consecutive light-emitting modules to simplify a manufacturing process of the distributed feedback laser array, to make the distributed feedback laser array be more integrated, and to make a field of laser generated by at least one of multiple lasing spots included in the two consecutive light-emitting modules better. In addition, because a first electrode layer of the distributed feedback laser array has a predetermined pattern, the distributed feedback laser array can use the predetermined pattern to more flexibly control at least one lasing spot of the multiple lasing spots to generate at least one laser. Therefore, compared with the prior art, the present invention can increase emitting power, optimize a field of the laser, and reduce cost of the distributed feedback laser array.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
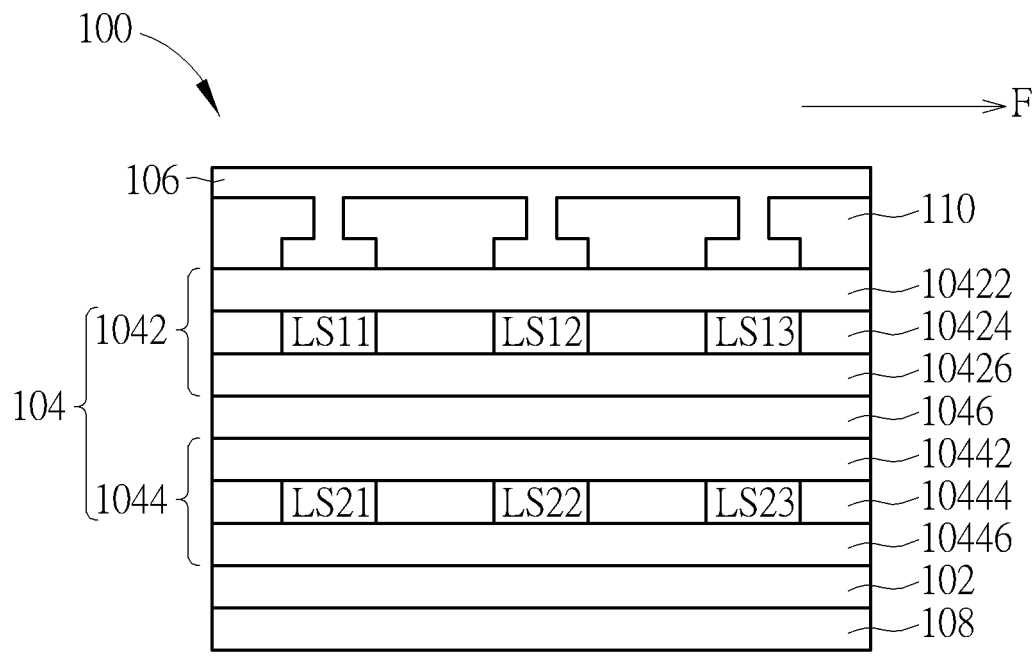
FIG. 1 is a diagram illustrating a distributed feedback laser array according to a first embodiment of the present invention.

Please refer to FIG. 1. FIG. 1 is a diagram illustrating a cross-section view of a distributed feedback laser array 100 according to the first embodiment of the present invention, wherein the distributed feedback laser array 100 includes a substrate 102, a semiconductor stacked structure 104, a first electrode layer 106, and a second electrode layer 108. The substrate 102 is composed of an N-type indium phosphide substrate (InP), and the first electrode layer 106 is titanium (Ti), or platinum (Pt), or aurum (Au), and the second electrode layer 108 is aurum (Au), or germanium (Ge), or nickel (Ni). As shown in FIG. 1, the semiconductor stacked structure 104 is formed above a surface of the substrate 102, the semiconductor stacked structure 104 includes two light-emitting modules 1042, 1044 and a tunnel junction 1046, the tunnel junction 1046 is installed between the two light-emitting modules 1042, 1044, and the two light-emitting modules 1042, 1044 are broad-area laser emitting modules. The tunnel junction 1046 is composed of indium gallium arsenide/indium phosphide (InGaAs/InP), or indium gallium arsenide/indium gallium arsenide (InGaAs/InGaAs), or indium aluminum arsenide/indium phosphide (InAlAs/InP), or aluminum arsenide/indium phosphide (AlAs/InP). As shown in FIG. 1, the light-emitting module 1042 includes an active layer 10424, a first cladding layer 10422, and a second cladding layer 10426, wherein the active layer 10424 is installed between the first cladding layer 10422 and the second cladding layer 10426. The light-emitting module 1044 includes an active layer 10444, a first cladding layer 10442, and a second cladding layer 10446, wherein the active layer 10444 is installed between the first cladding layer 10442 and the second cladding layer 10446. The first cladding layer 10422 and the first cladding layer 10442 are composed of P-type indium phosphide (InP) or P-type indium gallium arsenide (InGaAsP), the second cladding layer 10426 and the second cladding layer 10446 are composed of N-type indium phosphide (InP), and the active layers 10424 and 10444 are composed of indium gallium arsenide (InGaAsP) or indium gallium aluminum arsenide (InGaAlAs). Each active layer of the active layers 10424 and 10444 includes multiple lasing spots along a first direction FD (as shown in FIG. 1), wherein the multiple lasing spots are for generating multiple lasers. For example, as shown in FIG. 1, the active layer 10424 includes three lasing spots LS11, LS12, and LS13 along the first direction FD for generating three lasers, and the active layer 10444 includes three lasing spots LS21, LS22, and LS23 along the first direction FD for generating three lasers. In addition, the present invention is not limited to the distributed feedback laser array 100 including the two light-emitting modules 1022, 1024 and the tunnel junction 1046. That is, the distributed feedback laser array 100 can include more than two light-emitting modules, and one tunnel junction is installed between each two consecutive light-emitting modules of the more than two light-emitting modules. In addition, the first electrode layer 106 is formed above the semiconductor stacked structure 104, and the second electrode layer 108 is formed above another surface of the substrate 102.

Figure 2:
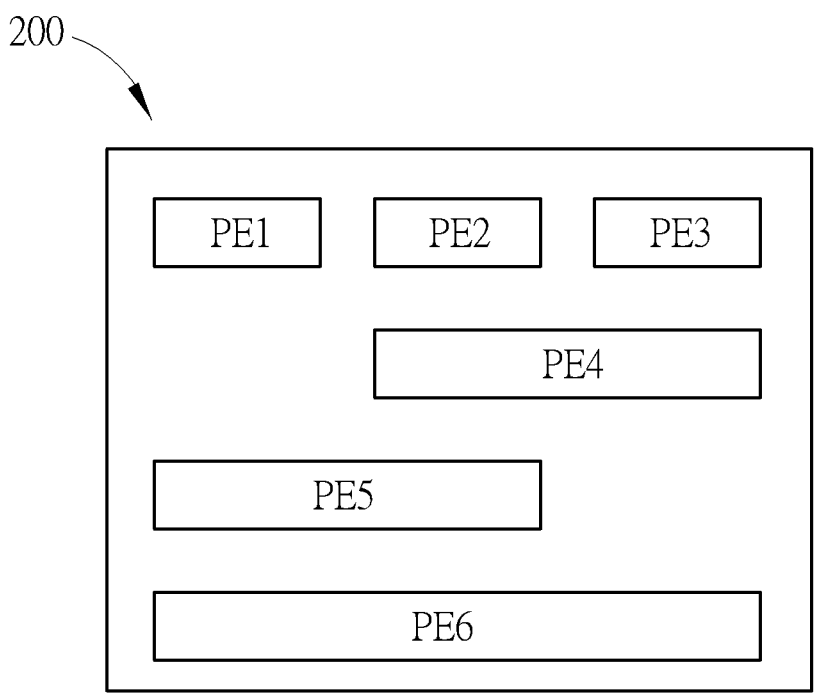
FIG. 2 is a diagram illustrating a top view of a first electrode layer having a predetermined pattern.

Further, as shown in FIG. 2, the first electrode layer 106 in the distributed feedback laser array 100 has a predetermined pattern 200. The predetermined pattern 200 includes electrodes PE1, PE2, PE3, PE4, PE5, PE6, wherein the electrodes PE1, PE2, PE3, PE4, PE5, and PE6 are separated from each other by an insulator 110 further included in the distributed feedback laser array 100. In one embodiment of the present invention, as shown in FIG. 2, when a first operational voltage is applied to the electrode PE1, the first electrode layer 106 can control the lasing spots LS11 and LS21 to emit lasers. In addition, in another embodiment of the present invention, as shown in FIG. 2, when a second operational voltage is applied to the electrode PE5, the first electrode layer 106 can control the lasing spots LS11, LS21, LS12, LS22 to emit lasers. In addition, in another embodiment of the present invention, as shown in FIG. 2, when a third operational voltage is applied to the electrode PE6, the first electrode layer 106 can control the lasing spots LS11, LS21, LS12, LS22, LS13, LS23 to emit lasers. Because the tunnel junction 1046 is installed between the light-emitting modules 1042, 1044, the distributed feedback laser array 100 does not require multiple lenses to be installed between the light-emitting modules 1042, 1044, and a field of the laser emitted by the above-mentioned lasing spots is better.

Further, the first operational voltage, the second operational voltage, and the third operational voltage may be the same or different. In addition, the operational principles of the electrodes PE2, PE3, PE4 can be referred to the operational principles of the electrodes PE1, PE5, so further description thereof is omitted for simplicity. In addition, in another embodiment of the present invention, different operational voltages or the same operational voltage can be applied to at least two electrodes of the electrodes PE1, PE2, PE3, PE4, PE5, PE6. In addition, the present invention is not limited to the predetermined pattern 200, that is, the first electrode layer 106 may include other predetermined patterns. Meanwhile, the first electrode layer 106 can control at least one of the lasing spots LS11, LS12, LS13, LS21, LS22, and LS23 to generate at least one laser through electrodes included in the other predetermined patterns.

To sum up, the distributed feedback laser array provided by the present invention uses the tunnel junction to be installed between the two consecutive light-emitting modules to simplify a manufacturing process of the distributed feedback laser array, to make the distributed feedback laser array be more integrated, and to make a field of laser generated by the at least one of the lasing spots better. In addition, because the first electrode layer of the distributed feedback laser array has the predetermined pattern, the distributed feedback laser array can use the predetermined pattern to more flexibly control at least one of the lasing spots to generate at least one laser. Therefore, compared with the prior art, the present invention can increase emitting power, optimize a field of the laser, and reduce cost of the distributed feedback laser array.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A distributed feedback laser array (DFB), comprising:
   a substrate;
   a semiconductor stacked structure formed above a surface of the substrate, wherein the semiconductor stacked structure comprises:
      two light-emitting modules, each light-emitting module of the two light-emitting modules comprises an active layer, a first cladding layer, and a second cladding layer, wherein the active layer is installed between the first cladding layer and the second cladding layer, the active layer comprises multiple lasing spots along a first direction, the multiple lasing spots of the each light-emitting module are used for generating multiple laser beams, and multiple lasing spots comprised in the two light-emitting modules form a two-dimensional lasing array; and a tunnel junction installed between the two light-emitting modules;

a first electrode layer formed above the semiconductor stacked structure; and a second electrode layer formed above another surface of the substrate;

wherein the first electrode layer and the second electrode layer are used for controlling the multiple lasing spots of the two light-emitting modules to generate laser beams of the two-dimensional lasing array.

2. The distributed feedback laser array of claim 1, wherein polarity of the first cladding layer is different from polarity of the second cladding layer.

3. The distributed feedback laser array of claim 1, wherein the first cladding layer is installed above the active layer, and the active layer is installed above the second cladding layer.

4. The distributed feedback laser array of claim 1, wherein the active layer comprises a semiconductor material for generating the multiple laser beams, and the semiconductor material is indium gallium arsenide phosphide (InGaAsP) or indium gallium aluminum arsenide (InGaAlAs).

5. The distributed feedback laser array of claim 1, wherein the substrate is composed of indium phosphide (InP).

6. The distributed feedback laser array of claim 1, wherein the first cladding layer is composed of indium phosphide (InP) or indium gallium arsenide phosphide (InGaAsP), and the second cladding layer is composed of indium phosphide (InP).

7. The distributed feedback laser array of claim 1, wherein the tunnel junction is composed of indium gallium arsenide/indium phosphide (InGaAs/InP), or indium gallium arsenide/indium gallium arsenide (InGaAs/InGaAs), or indium aluminum arsenide/indium phosphide (InAlAs/InP), or aluminum arsenide/indium phosphide (AlAs/InP).

8. The distributed feedback laser array of claim 1, wherein a material of the first electrode layer is titanium (Ti), or platinum (Pt), or gold (Au).

9. The distributed feedback laser array of claim 1, wherein a material of the second electrode layer is gold (Au), or germanium (Ge), or nickel (Ni).

10. The distributed feedback laser array of claim 1, wherein the first electrode layer is used for controlling at least one lasing spot of the multiple lasing spots to generate at least one laser beam of the multiple laser beams.

11. The distributed feedback laser array of claim 10, wherein the first electrode layer has a predetermined pattern, and the first electrode layer controls the at least one lasing spot of the multiple lasing spots to generate the at least one laser beam of the multiple laser beams through the predetermined pattern.

12. A distributed feedback laser array, comprising:
a substrate;
a semiconductor stacked structure formed above a surface of the substrate, wherein the semiconductor stacked structure comprises:
two light-emitting modules, each of the two light-emitting modules comprises multiple lasing spots along a first direction, wherein the multiple lasing spots of the each light-emitting module are used for generating the multiple laser beams, and multiple lasing spots comprised in the two light-emitting modules form a two-dimensional lasing array; and
a tunnel junction installed between the two light-emitting modules;
a first electrode layer formed above the semiconductor stacked structure and having a predetermined pattern, wherein the first electrode layer controls at least one lasing spot of the multiple lasing spots to generate at least one laser beam of the multiple laser beams through the predetermined pattern; and
a second electrode layer formed above another surface of the substrate;
wherein the first electrode layer and the second electrode layer are used for controlling the multiple lasing spots of the two light-emitting modules to generate laser beams of the two-dimensional lasing array.

* * * * *